(12) United States Patent
Kim et al.

(10) Patent No.: US 12,471,457 B2
(45) Date of Patent: Nov. 11, 2025

(54) DISPLAY DEVICE

(71) Applicant: Samsung Display Co., LTD., Yongin-si (KR)

(72) Inventors: Won Tae Kim, Hwaseong-si (KR); Jae Han Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 609 days.

(21) Appl. No.: 17/660,774

(22) Filed: Apr. 26, 2022

(65) Prior Publication Data

US 2022/0367594 A1 Nov. 17, 2022

(30) Foreign Application Priority Data

May 14, 2021 (KR) ........................ 10-2021-0062349

(51) Int. Cl.
*H10K 59/131* (2023.01)
*H10K 59/121* (2023.01)
(52) U.S. Cl.
CPC ....... *H10K 59/131* (2023.02); *H10K 59/1213* (2023.02)
(58) Field of Classification Search
None
See application file for complete search history.

(56) References Cited

U.S. PATENT DOCUMENTS

| 2009/0048733 A1* | 2/2009 | Isono | B60C 23/127 701/36 |
| 2015/0262528 A1* | 9/2015 | Takahara | G09G 3/3258 345/212 |
| 2016/0190228 A1* | 6/2016 | Park | H10K 59/1315 257/40 |
| 2019/0027096 A1* | 1/2019 | Kim | H10K 59/805 |
| 2019/0164877 A1* | 5/2019 | Cho | H01L 23/4985 |

FOREIGN PATENT DOCUMENTS

| KR | 2014-0050831 A | 4/2014 |
| KR | 2017-0081075 A | 7/2017 |

\* cited by examiner

*Primary Examiner* — Cory W Eskridge
(74) *Attorney, Agent, or Firm* — Womble Bond Dickinson (US) LLP

(57) ABSTRACT

A display device includes: a display panel having: a display area including a plurality of pixels; and a non-display area around the display area and including a pad area; and a chip on film attached to the pad area of the display panel, wherein the chip on film includes the base film, and a data driver on the base film, wherein the chip on film includes a first lead area overlapping the pad area and defining one end of the chip on film, wherein the first lead area includes a first-first bypass lead area, a first-second bypass lead area, a first-third bypass lead area, and a first data lead area, wherein the first data lead area is respectively between the first-first bypass lead area and the first-third bypass lead area, and between the first-second bypass lead area and the first-third bypass lead area.

21 Claims, 18 Drawing Sheets

DISPLAY DEVICE

CROSS-REFERENCE TO RELATED APPLICATION

The present application claims priority to and the benefit of Korean Patent Application No. 10-2021-0062349 filed on May 14, 2021 in the Korean Intellectual Property Office, the entire content of which is incorporated herein by reference.

BACKGROUND

1. Field

Aspects of some embodiments of the present disclosure relates to a display device.

2. Description of Related Art

With the development of technology, display products having relatively improved performance that are smaller and lighter compared to previous generations of display products are being produced. Historically, cathode ray tube (CRT) display devices had been widely used as a display device due to many advantages in terms of performance and price. However, display devices which overcome certain downsides of CRT display devices in terms of miniaturization or portability, and including relative miniaturization, weight reduction, and low power consumption are attracting attention in the market. An example of such display devices may include plasma display devices, liquid crystal display devices, organic light emitting display devices, inorganic light emitting display devices, and quantum dot organic light emitting display devices, etc.

A display device may include a display panel that displays images and a data driver mounted on the display panel. The data driver may be provided in the form of a driver chip.

The above information disclosed in this Background section is only for enhancement of understanding of the background and therefore the information discussed in this Background section does not necessarily constitute prior art.

SUMMARY

Aspects of some embodiments according to the present disclosure may include a display device in which an amount of heat emission from an attachment portion between a display panel and a chip on film is relatively uniform across an entire area of the attachment portion.

Characteristics of embodiments according to the present disclosure are not limited to the above-mentioned purpose. Other purposes and characteristics according to the present disclosure that are not mentioned may be understood based on following descriptions, and may be more clearly understood based on embodiments according to the present disclosure. Further, it should be understood that the characteristics of embodiments according to the present disclosure may be realized using the characteristics and features described in the claims and combinations thereof.

A display device according to some embodiments includes a display panel having: a display area including a plurality of pixels; and a non-display area located around the display area and including a pad area; and a chip on film attached to the pad area of the display panel, wherein the chip on film includes the base film, and a data driver mounted on the base film, wherein the chip on film includes a first lead area overlapping the pad area and defining one end of the chip on film, wherein the first lead area includes a first-first bypass lead area, a first-second bypass lead area, a first-third bypass lead area, and a first data lead area, wherein the first data lead area is located respectively between the first-first bypass lead area and the first-third bypass lead area, and between the first-second bypass lead area and the first-third bypass lead area.

According to some embodiments, a chip on film includes a base film; and a data driver mounted on the base film, wherein the chip on film has a first lead area defining one end of the chip on film, wherein the first lead area includes a first-first bypass lead area, a first-second bypass lead area, a first-third bypass lead area, and a first data lead area, wherein the first data lead area is located respectively between the first-first bypass lead area and the first-third bypass lead area, and between the first-second bypass lead area and the first-third bypass lead area, wherein a first bypass lead is located in each of the first-first bypass lead area, the first-second bypass lead area, and the first-third bypass lead area, wherein each of differences between an area size of the first bypass lead located in the first-first bypass lead area, an area size of the first bypass lead located in the first-second bypass lead area, and an area size of the first bypass lead located in the first-third bypass lead area is within 5%.

Specific details of other embodiments are included in the detailed description and drawings.

According to some embodiments, an amount of heat emission from an attachment portion between the display panel and the chip on film may be uniform across an entire area of the attachment portion.

Characteristics of embodiments according to the present disclosure are not limited to the above-mentioned characteristics, and other characteristics as not mentioned will be more clearly understood by those skilled in the art from following descriptions.

BRIEF DESCRIPTION OF DRAWINGS

The above and other aspects and characteristics of some embodiments according to the present disclosure will become more apparent by describing in more detail aspects of some embodiments thereof with reference to the attached drawings, in which.

DETAILED DESCRIPTION

Figure 1:
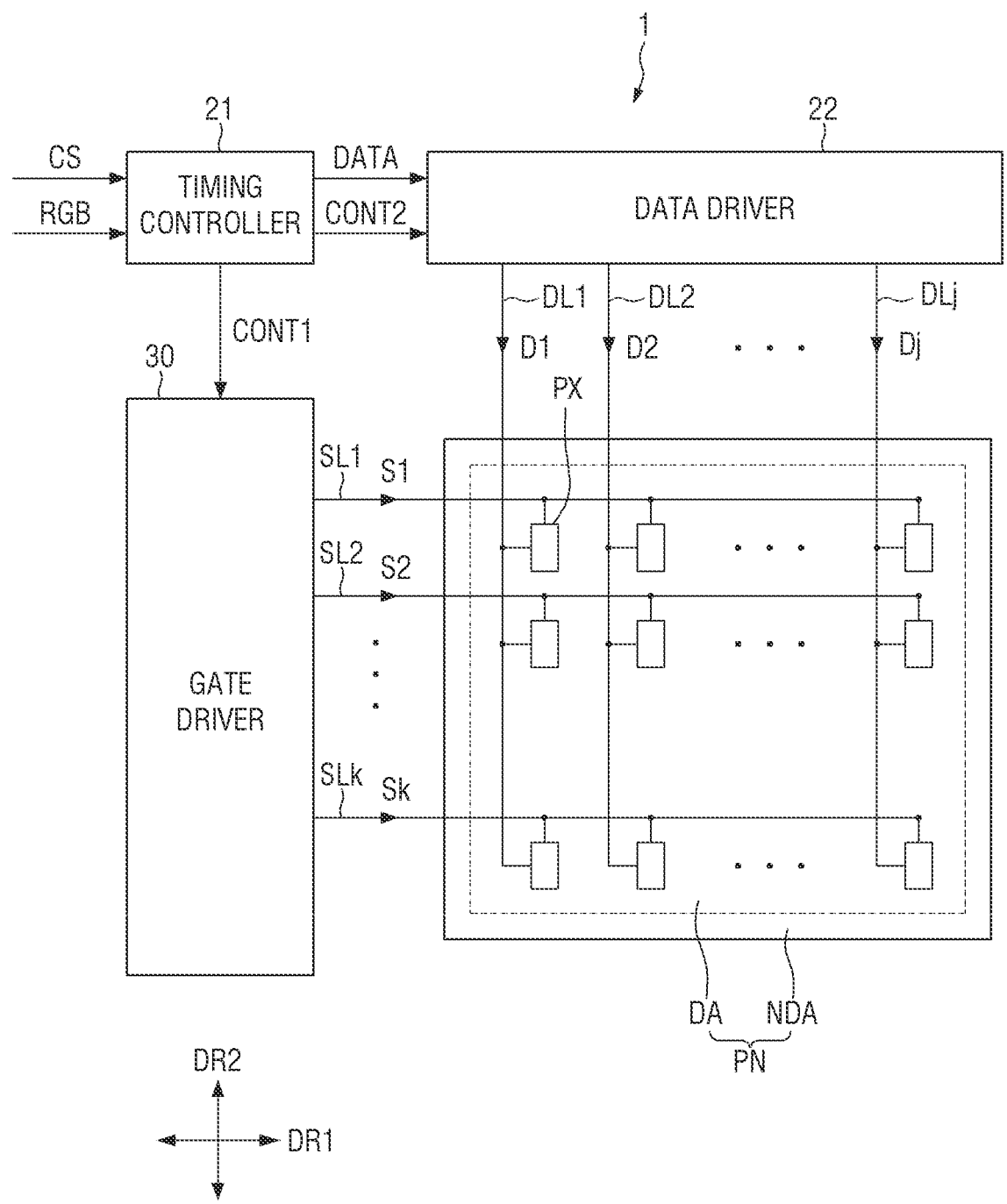
FIG. 1 is a block diagram schematically showing a display device according to some embodiments.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing an embodiments of the present disclosure are merely examples, and embodiments according to the present disclosure are not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be arranged directly on or beneath the second element or may be arranged indirectly on or beneath the second element with a third element or layer being located between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is located "on" or "on a top" of another layer, film, region, plate, or the like, the former may directly contact the latter or still another layer, film, region, plate, or the like may be located between the former and the latter. As used herein, when a layer, film, region, plate, or the like is directly located "on" or "on a top" of another layer, film, region, plate, or the like, the former directly contacts the latter and still another layer, film, region, plate, or the like is not located between the former and the latter. Further, as used herein, when a layer, film, region, plate, or the like is located "below" or "under" another layer, film, region, plate, or the like, the former may directly contact the latter or still another layer, film, region, plate, or the like may be located between the former and the latter. As used herein, when a layer, film, region, plate, or the like is directly arranged "below" or "under" another layer, film, region, plate, or the like, the former directly contacts the latter and still another layer, film, region, plate, or the like is not arranged between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings is turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

"DR1 direction" and "DR2 direction" should not be interpreted only to have a geometric relationship in which the DR1 direction and the DR2 direction are perpendicular to each other. "DR1 direction" and "DR2 direction" may be interpreted to have a broader direction within a range in which components herein may work functionally.

Hereinafter, aspects of some embodiments will be described in more detail with reference to the accompanying drawings.

FIG. 1 is a block diagram schematically showing a display device according to some embodiments.

Referring to FIG. 1, a display device 1 displays a video (e.g., moving) or a still (e.g., static) image. The display device 1 may refer to any electronic device that includes a display screen capable of displaying images. For example, the display device 1 may include a televisions, a laptop, a monitors, a billboard, an Internet of Thing, a mobile phone, a smart phone, a tablet PC (personal computer), an electronic watch, a smart watch, a watch phone, a head mounted display (HMD), a mobile communication terminal, an electronic notebook, an e-book, a PMP (Portable Multimedia Player), a navigation device, a game device, a digital camera, a camcorder, etc. which may provide a display screen.

The display device 1 according to some embodiments includes a display panel PN, an integrated driver circuit 21 and 22, and a scan driver 30. The integrated driver circuit 21 and 22 may include a timing controller 21 and a data driver 22.

The display panel PN may include a display area DA where pixels PXs are arranged to display images, and a non-display area NDA as an area surrounding the display area DA. When the display panel PN includes a curved portion, the display area DA may be partially arranged in the curved portion. In this case, an image of the display panel PN may be displayed on the curved portion.

In the display area DA, not only the pixels PXs, but also scan lines SL1 to SLk (k is an integer greater than or equal to 2), data lines DL1 to DLj (j is an integer greater than or equal to 2), and power lines which are connected to the pixels PXs may be arranged. The scan lines SLs may extend in the first direction DR1, and may be arranged in the second direction DR2 intersecting the first direction DR1. The data lines DLs may extend in the second direction DR2 intersecting the first direction DR1 and may be arranged in the first direction DR1. Each of the pixels PXs may be connected to at least one of the scan lines SLs or one of the data lines DLs.

The display panel PN may include any suitable number of pixels PX, data lines DL1 to DLi, scan lines SL1 to SLk, and power lines, according to the design of the display panel PN.

Each of the pixels may include a driving transistor, at least one switching transistor, a light-emissive element, and a capacitor. The switching transistor may be turned on when a scan signal is applied thereto from the scan line SL. Thus, a data voltage of the data line DL may be applied to a gate electrode of the driving transistor. The driving transistor may supply a drive current to the light-emissive element based on the data voltage applied to the gate electrode such that the light-emissive element emits light. Each of the driving transistor and the at least one switching transistor may be embodied as a thin-film transistor. The light-emissive element may emit light according to the drive current of the driving transistor. The light-emissive element may be embodied as an organic light emitting diode including a first electrode, an organic light-emissive layer, and a second electrode. The capacitor may play a role of maintaining the data voltage applied to the gate electrode of the driving transistor at a constant level.

The non-display area NDA may be defined as an area from an outer edge of the display area DA to an outer edge of the display panel PN. The scan driver 30 for applying the scan signals to the scan line SLs and the integrated driver circuit 21 and 22 may be located in the non-display area NDA.

The integrated driver circuit 21 and 22 may output signals and voltages for driving the display panel PN. To this end, the integrated driver circuit 21 and 22 may include the timing controller 21 and the data driver 22 (e.g., integrated or incorporated into a single element or component, according to some embodiments).

The timing controller 21 receives digital video data DATA and timing signals from a host system. The timing signals may include a vertical sync signal, a horizontal sync signal, a data enable signal, and a dot clock. The host system may be embodied as an application processor of a smartphone or a tablet PC, or a system-on-chip of a monitor or a TV, or the like.

The timing controller 21 generates control signals CSs to control an operation timing of each of the data driver 22 and the scan driver 30. The control signals CSs may include a source control signal CONT2 for controlling the operation timing of the data driver 22 and a scan control signal CONT1 for controlling the operation timing of the scan driver 30.

The data driver 22 receives the digital video data DATA and the source control signal CONT2 from the timing controller 21. The data driver 22 converts the digital video data DATA into analog data voltages according to the source control signal CONT2 and supplies the analog data voltages to the data lines DL1 to DLj of the display panel PN.

The integrated driver circuit 21 and 22 may be located in the non-display area NDA located at one side of the display panel PN. The integrated driver circuit 21 and 22 may be embodied as an integrated circuit (IC), and may be mounted on the display panel PN using a COG (chip on glass) scheme, a COP (chip on plastic) scheme, or an ultrasonic bonding scheme. However, embodiments according to the present disclosure are not limited thereto. For example, the integrated driver circuit 21 and 22 may be mounted on a circuit board instead of the display panel PN.

Further, FIG. 1 illustrates that the integrated driver circuit 21 and 22 includes the data driver 22 and the timing controller 21. However, embodiments according to the present disclosure are not limited thereto. The data driver 22 and the timing controller 21 may not be integrated into a single integrated circuit, but may be respectively embodied as separate integrated circuits. In this case, the data driver 22 may be mounted on the display panel PN using a COG (chip on glass) scheme, a COP (chip on plastic) scheme, or an ultrasonic bonding scheme, and the timing controller 21 may be mounted on the circuit board using a COG (chip on glass) scheme, a COP (chip on plastic) scheme, or an ultrasonic bonding scheme.

The scan driver 30 receives the scan control signal CONT1 from the timing controller 21. The scan driver 30 generates the scan signals according to the scan control signal CONT1 and supplies the scan signals to the scan lines SL1 to SLk of the display panel PN. The scan driver 30 may be located in the non-display area NDA of the display panel PN and may include a multiple of transistors. Alternatively, the scan driver 30 may be embodied or implemented as an integrated circuit. In this case, the scan driver may be mounted on a gate flexible film attached to the other side of the display panel PN.

According to some embodiments, the circuit board may be attached on pads located at one side edge of the display panel PN using an anisotropic conductive film. Accordingly, lead lines of the circuit board may be electrically connected to the pads. The circuit board may be embodied or implemented as a flexible film such as a flexible printed circuit board, a printed circuit board or a chip on film. The circuit board may be bent downwardly of the display panel PN. In this case, one side of the circuit board may be attached to one side edge of the display panel PN, while the opposite side of the circuit board may be located under the display panel PN and thus may be connected to a system board on which the host system is mounted.

A power supply circuit may generate voltages required to drive the display panel PN from a main power applied from the system board and supply the voltages to the display panel PN. For example, the power supply circuit may generate a first power voltage and a second power voltage to drive the light-emissive elements ELs of the display panel PN from the main power and may supply the second power voltage and the first power voltage to a second voltage electrode VDD (shown in FIG. 2) and a first voltage electrode VSS (shown in FIG. 3) of the display panel PN, respectively. Further, the power supply circuit may generate drive voltages for driving the integrated driver circuit 21 and 22 and the scan driver 30 from the main power and may supply the drive voltages to the integrated driver circuit 21 and 22 and the scan driver 30.

The power supply circuit may be embodied or implemented as an integrated circuit and may be mounted on the circuit board. However, embodiments according to the present disclosure are not limited thereto. For example, the power supply circuit may be integrated into the integrated driver circuit 21 and 22.

Figure 2:
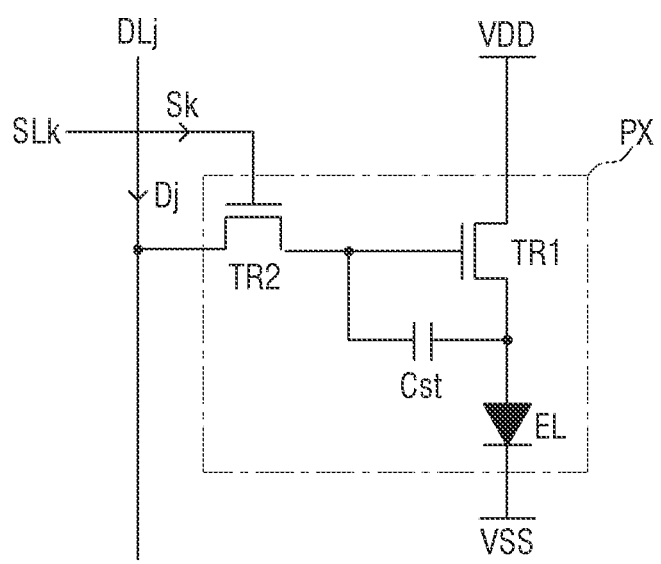
FIG. 2 is a circuit diagram showing one pixel of FIG. 1.

FIG. 2 is a circuit diagram showing an example circuit structure of one pixel of FIG. 1 according to some embodiments.

Referring to FIG. 2, the pixel PX may include a first transistor TR1, a second transistor TR2, a light-emissive element EL, and a capacitor Cst. FIG. 2 shows that each pixel PX has a 2T1C (2Transistor-1Capacitor) structure having one first transistor TR1 and one second transistor TR2 and one capacitor Cst. Embodiments according to the present disclosure are not limited thereto. Each pixel PX may include a larger number of transistors and a plurality of capacitors. That is, according to various embodiments, each pixel PX may include additional components or fewer components without departing from the spirit and scope of embodiments according to the present disclosure.

Each of the first and second transistors TR1 and TR2 may include a first electrode, a second electrode, and a gate electrode. One of the first and second electrodes may act as a source electrode, and the other thereof may act as a drain electrode.

Each of the first and second transistors TR1 and TR2 may be embodied as a thin-film transistor. Further, in FIG. 2, an example in which each of the first and second transistors TR1 and TR2 is embodied as an N-type MOSFET (Metal Oxide Semiconductor Field Effect Transistor) is illustrated. Embodiments according to the present disclosure are not limited thereto. Each of the first transistor TR1 and the second transistor TR2 may be embodied as a P-type MOSFET. In this case, positions of the source electrode and the drain electrode of each of the first transistor TR1 and the second transistor TR2 may be changed. Hereinafter, an example in which each of the first and second transistors TR1 and TR2 is embodied as an N-type MOSFET will be described in more detail.

The first transistor TR1 may supply a drive current to the light-emissive element EL according to the data voltage applied to a gate electrode thereof such that the light-emissive element EL emits light. That is, the first transistor TR1 may act as a driving transistor. The gate electrode of the first transistor TR1 may be connected to a source electrode of the second transistor TR2, a source electrode of the first transistor TR1 may be connected to a first electrode of the light-emissive element EL, and a drain electrode of the first transistor TR1 may be connected to the first power line VDD to which the first power voltage is applied.

The second transistor TR2 may be turned on when the scan signal is applied thereto from a k-th (k is a positive integer) scan line SLk. Thus, the data voltage of a j-th (j is a positive integer) data line DLj may be applied to the gate electrode of the first transistor TR1. That is, the second transistor TR2 may act as a switching transistor. A gate electrode of the second transistor TR2 may be connected to the k-th scan line SLk, a source electrode thereof may be connected to the gate electrode of the first transistor TR1, and a drain electrode thereof may be connected to the j-th data line DLj.

The capacitor Cst may be connected to and located between the gate electrode and the source electrode of the first transistor TR1. Thus, the capacitor Cst may play a role of maintaining the data voltage applied to the gate electrode of the first transistor TR1 at a constant level.

The light-emissive element EL may emit light according to the drive current of the first transistor TR1. The light-emissive element EL may be embodied as an organic light emitting diode including a first electrode, an organic light-emissive layer, and a second electrode. The first electrode of the light-emissive element EL may be connected to the source electrode of the first transistor TR1, while the second electrode thereof may be connected to the second power line VSS to which the second power voltage lower than the first power voltage is applied.

Figure 3:
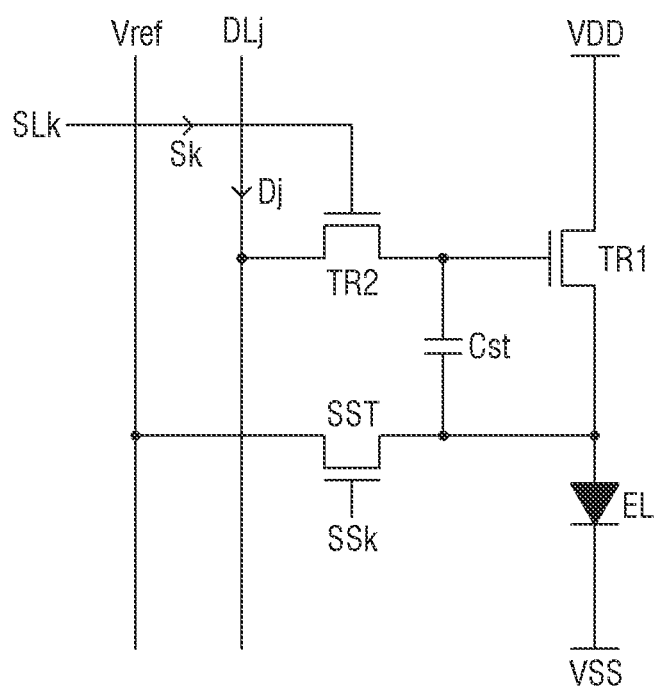
FIG. 3 is a circuit diagram showing one pixel of FIG. 1.

FIG. 3 is a circuit diagram showing aspects of a circuit of one pixel of FIG. 1 according to some embodiments. Referring to FIG. 3, the pixel PX may include a first transistor TR1, a second transistor TR2, a sensing transistor SST, a light-emissive element EL, and a capacitor Cst. FIG. 3 shows that each pixel PX has a 3T1C (3Transistor-1Capacitor) structure having one first transistor TR1, one second transistor TR2, one sensing transistor SST, and one capacitor Cst. The circuit diagram of FIG. 3 is the same as the circuit diagram of FIG. 2 except that the former further includes the sensing transistor SST and a reference line Vref.

The circuit diagram in FIG. 3 may further include a compensation circuit including the sensing transistor SST and the reference line Vref. The compensation circuit may be added to each pixel PX to compensate for a threshold voltage of the first transistor TR as the driving transistor.

The sensing transistor SST may be connected to and located between the source electrode of the first transistor TR1 and the first electrode of the light-emissive element EL. The gate electrode of the sensing transistor SST may be connected to a k-th sensing signal line Ssk, the drain electrode thereof may be connected to the reference line Vref, and the source electrode thereof may be connected to one end of the capacitor Cst. The sensing transistor SST may be turned on based on a sensing signal of the k-th sensing signal line Ssk to supply a reference voltage transmitted through the reference line Vref to the source electrode of the first transistor TR1, or to sense a voltage or a current of the source electrode of the first transistor TR1.

The reference line Vref may be connected to the scan driver 30. In this case, the scan driver 30 may sense the source electrode of the first transistor TR1 of each pixel PX in real time, or during a non-display period of an image or during a N frame (N is an integer equal to or greater than 1) period, thereby generating a sensing result. In one example, the second transistor TR2 as a switching transistor and the sensing transistor SST as a sensing transistor may be turned on at the same time. In this case, according to a time division scheme of the scan driver 30, a sensing operation through the reference line Vref and a data output operation for outputting the data signal are separated from each other.

In addition, a compensation target based on the sensing result may be a digital data signal, an analog data signal, or gamma. Further, the compensation circuit that generates a compensation signal based on the sensing result may be located in the scan driver 30, or in the timing controller 21, or may be embodied as a separate circuit.

Figure 4:
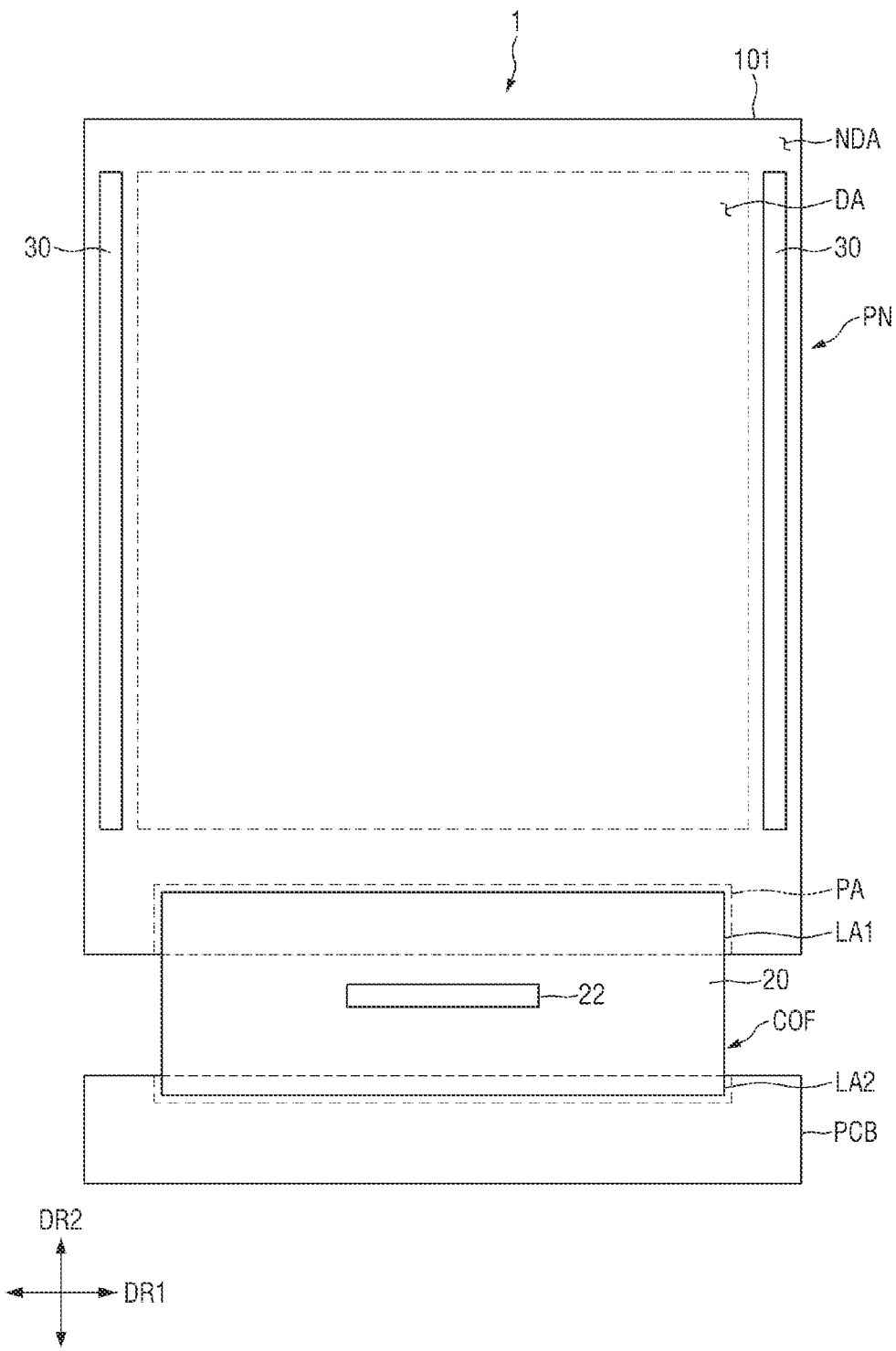
FIG. 4 is a plan view of a display device according to some embodiments.

FIG. 4 is a plan view of a display device according to some embodiments.

Referring to FIG. 4, an example of a display panel (see PN in FIG. 1) including a substrate 101 of a display device 1 may include a LED display panel, an organic light emitting display panel, a quantum dot light emitting display panel, a plasma display panel, a field emission display panel, etc.

A shape of the display device 1 may be variously modified. For example, the display device 1 may have a shape such as a horizontally long rectangle, a vertically long rectangle, a square, a rectangle with rounded corners, other polygons, or a circle. A shape of a display area DA of the display device 1 may also be similar to a general shape of the display device 1. FIG. 4 illustrates the display device 1 and the display area DA, each having a vertically long rectangular shape.

The display device 1 may include the display area DA and a non-display area NDA. The display area DA refers to an area where a screen may be displayed, and the non-display area NDA refers to an area where the screen is not displayed. The display area DA may be referred to as an active area, and the non-display area NDA may also be referred to as an inactive area.

The display area DA may usually occupy an inner region of the display device 1. The display area DA may include a plurality of pixels PXs. The plurality of pixels PXs may be arranged in a matrix form. A shape of each pixel PX may be a rectangle or a square in a plan view. However, embodiments according to the present disclosure are not limited thereto. Each pixel may have a rhombus shape in which each side is inclined with respect to the first direction DR1.

A plurality of scan drivers 30 may be provided. Each of the scan drivers 30 may be located in each non-display area NDA located on each of both opposing sides in the first direction DR1 of the display area DA. However, embodiments according to the present disclosure are not limited thereto. There may be only one scan driver 30.

The non-display area NDA may include a pad area PA. The pad area PA may be located, for example, on the opposite side in the second direction DR2 (bottom side in FIG. 4) of the display area DA. Embodiments according to the present disclosure are not limited thereto.

A chip on film (COF) may be attached to the pad area PA.

The chip on film COF includes a base film 20, and a data driver 22 mounted on the base film 20. The chip on film COF may include a first lead area LA1 overlapping the pad area PA and defining one side (one end) in the second direction DR2 of the chip on film COF, and a second lead area LA2 to which a printed circuit board PCB is attached. The second lead area LA2 may define the opposite side (opposite end) in the second direction DR2 of the chip on film (COF). In a plan view, the data driver 22 may be located between the first lead area LA1 and the second lead area LA2.

Figure 5:
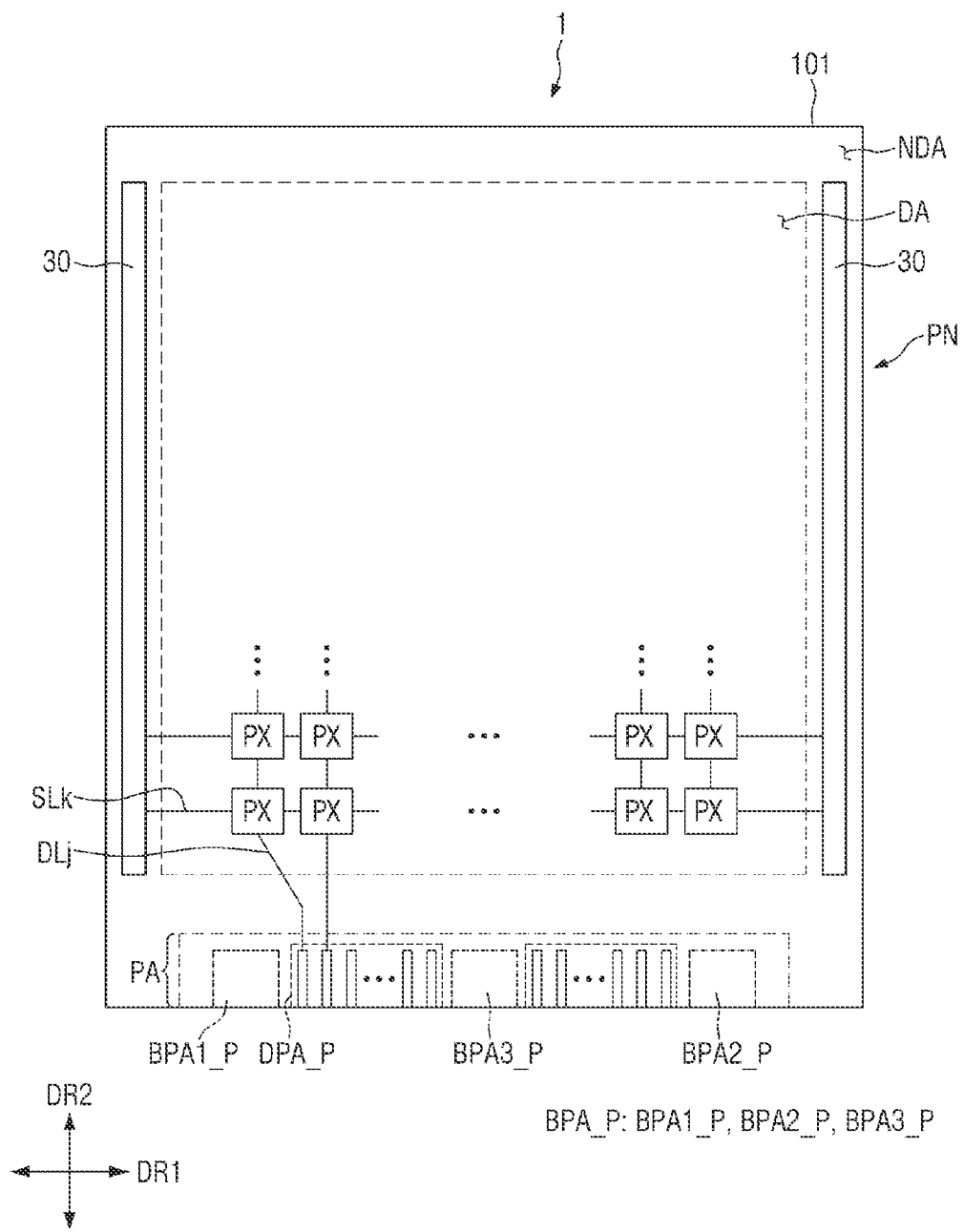
FIG. 5 is a plan view of a display panel of the display device according to FIG. 4.

FIG. 5 is a plan view of the display panel of the display device according to FIG. 4.

Referring to FIG. 5, the pad area PA may include a bypass pad area BPA_P and data pad area DPA_P. The bypass pad area BAP_P may include a first bypass pad area BAP1_P, a second bypass pad area BAP2_P, and a third bypass pad area BAP3_P. The data pad area DPA_P may be arranged between the first bypass pad area BAP1_P and the third bypass pad area BAP3_P and between the third bypass pad area BAP3_P and the second bypass pad area BAP2_P. A plurality of data pads may be arranged in the data pad area DPA_P. Each of the data pads may be connected to each pixel PX via each data line DLj. The scan driver 30 may be connected to each pixel PX via each scan line SLk.

The first bypass pad area BAP1_P, the second bypass pad area BAP2_P, and the third bypass pad area BAP3_P may be located in the opposite side outer region, one side outer region and a middle region in the first direction DR1 of the pad area PA in a plan view, respectively. According to some embodiments, a spacing between the third bypass pad area BAP3_P and the first bypass pad area BAP1_P may be the same as the spacing between the third bypass pad area BAP3_P and the second bypass pad area BAP2_P.

Figure 6:
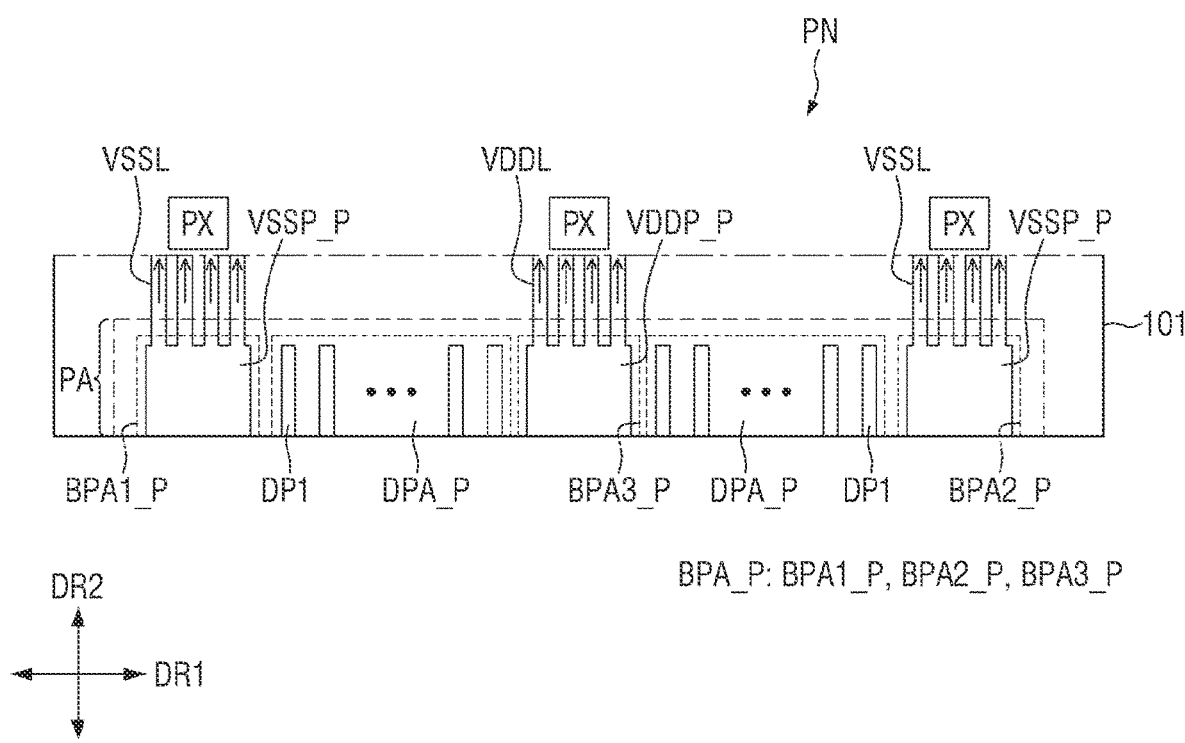
FIG. 6 is a detailed plan view showing a pad area of FIG. 5.

FIG. 6 is a detailed plan view showing the pad area of FIG. 5.

Referring to FIG. 6, each bypass pad may be located in each of the first bypass pad area BPA1_P to the third bypass pad area BPA3_P. The bypass pads may include a first bypass pad to a third bypass pad. The first bypass pad may be located in the first bypass pad area BPA1_P. The second bypass pad may be located in the second bypass pad area BPA2_P. The third bypass pad may be located in the third bypass pad area BPA3_P.

The first power voltage or the second power voltage may be applied to each of the first bypass pad to the third bypass pad. The first power voltage may be a low voltage, and the second power voltage may be a high voltage. However, embodiments according to the present disclosure are not limited thereto. The first power voltage may be a high voltage, and the second power voltage may be a low voltage.

Hereinafter, an example in which the first power voltage is applied to each of the first bypass pad and the second bypass pad, while the second power voltage is applied to the third bypass pad, and the first power voltage is a low voltage, while the second power voltage is a high voltage will be described in more detail. The first power voltage and the second power voltage may have different voltage signs. For example, a sign of the first power voltage may be negative, while a sign of the second power voltage may be positive. However, embodiments according to the present disclosure are not limited thereto.

In FIG. 6, each reference numeral is assigned to each of the first bypass pad to the third bypass pad based on the example in which the first power voltage is applied to the first bypass pad and the second bypass pad, while the second power voltage is applied to the third bypass pad, and the first power voltage is a low voltage while the second power voltage is a high voltage. A function of each of the first bypass pad to the third bypass pad is not limited to each reference numeral assigned thereto.

Further, since the same first power voltage is applied to the first bypass pad and the second bypass pad, for convenience of following descriptions, the same reference numeral "VSSP_P" is assigned to the first bypass pad and the second bypass pad, while a reference numeral "VDDP_P" is assigned to the third bypass pad.

Each of the first bypass pad VSSP_P and the second bypass pad VSSP_P may be connected to a multiple of first voltage lines VSSL, while the third bypass pad VDDP_P may be connected to a multiple of second voltage lines VDDL.

A plurality of data pads DP1 may be located in each data pad area DPA_P.

Figure 7:
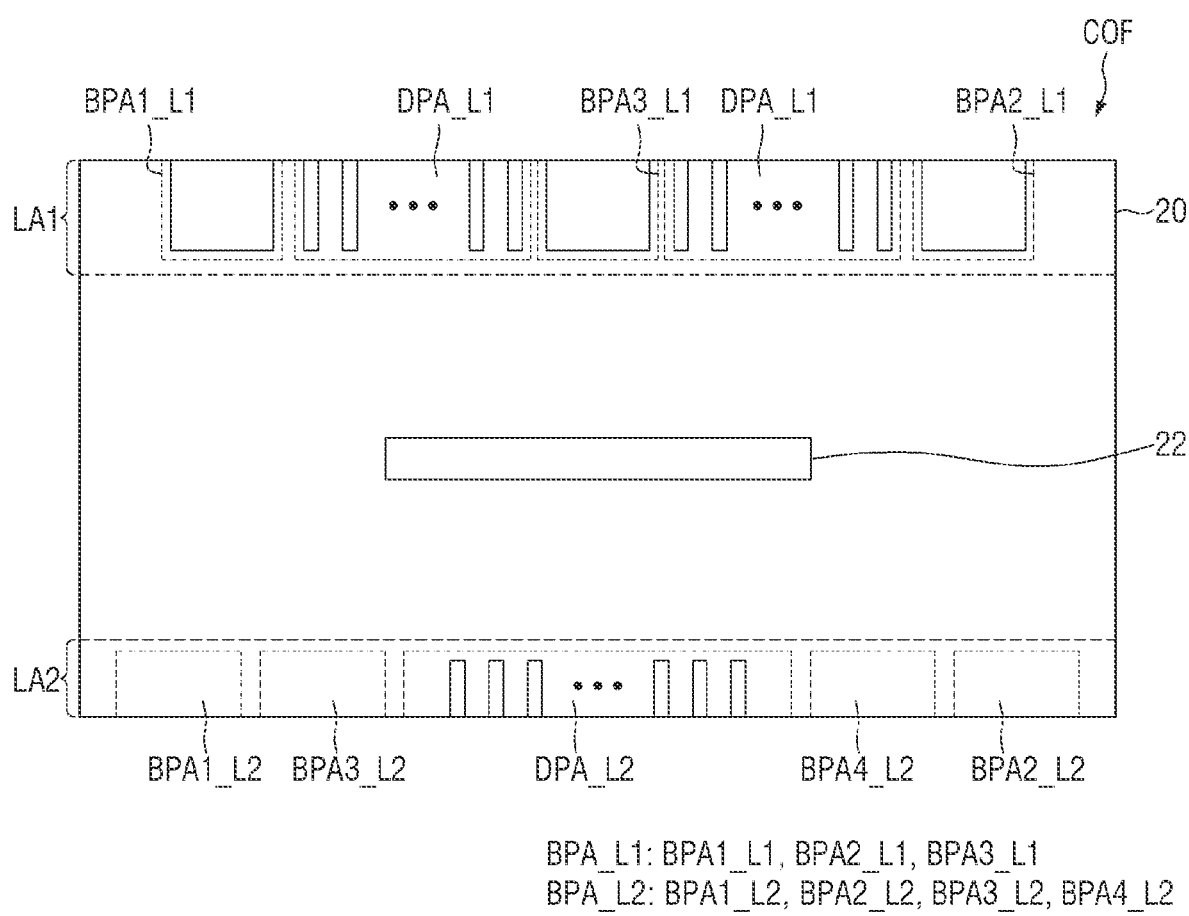
FIG. 7 is a detailed plan view showing a chip on film of FIG. 4.
Figure 8:
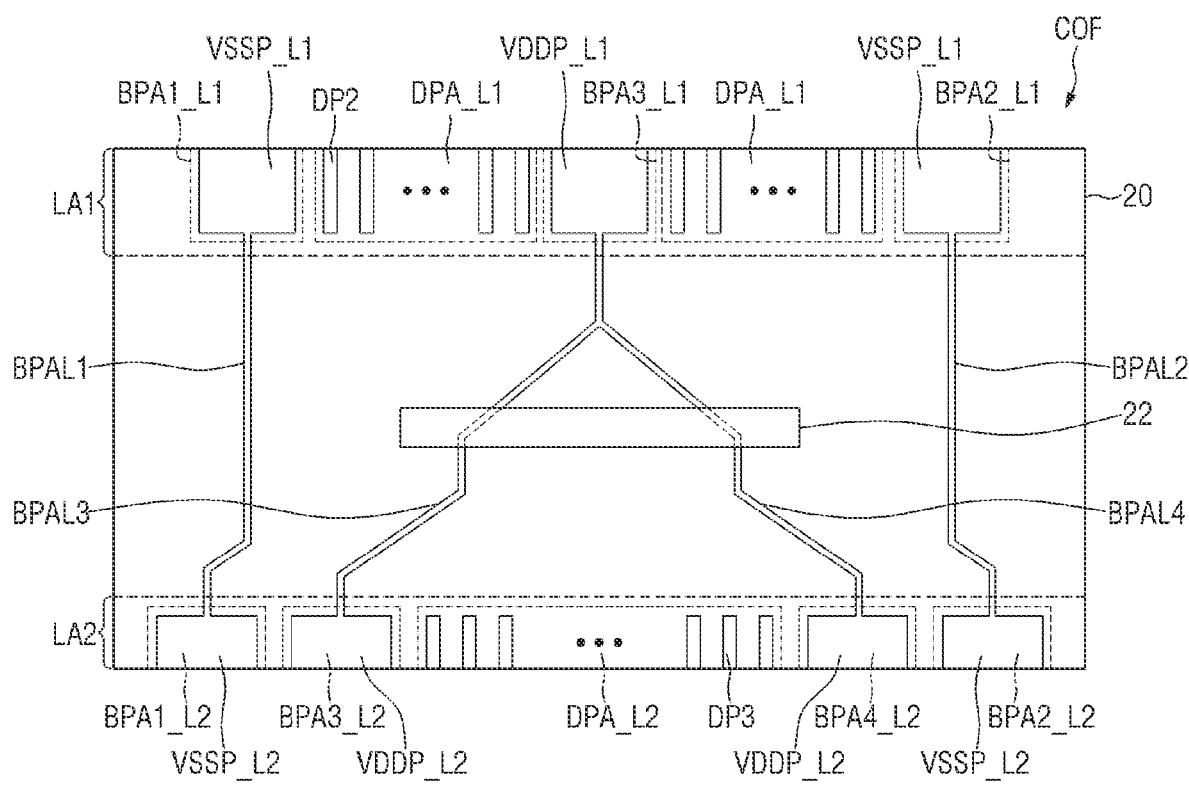
FIG. 8 is a more detailed plan view showing the chip on film of FIG. 7.
Figure 9:
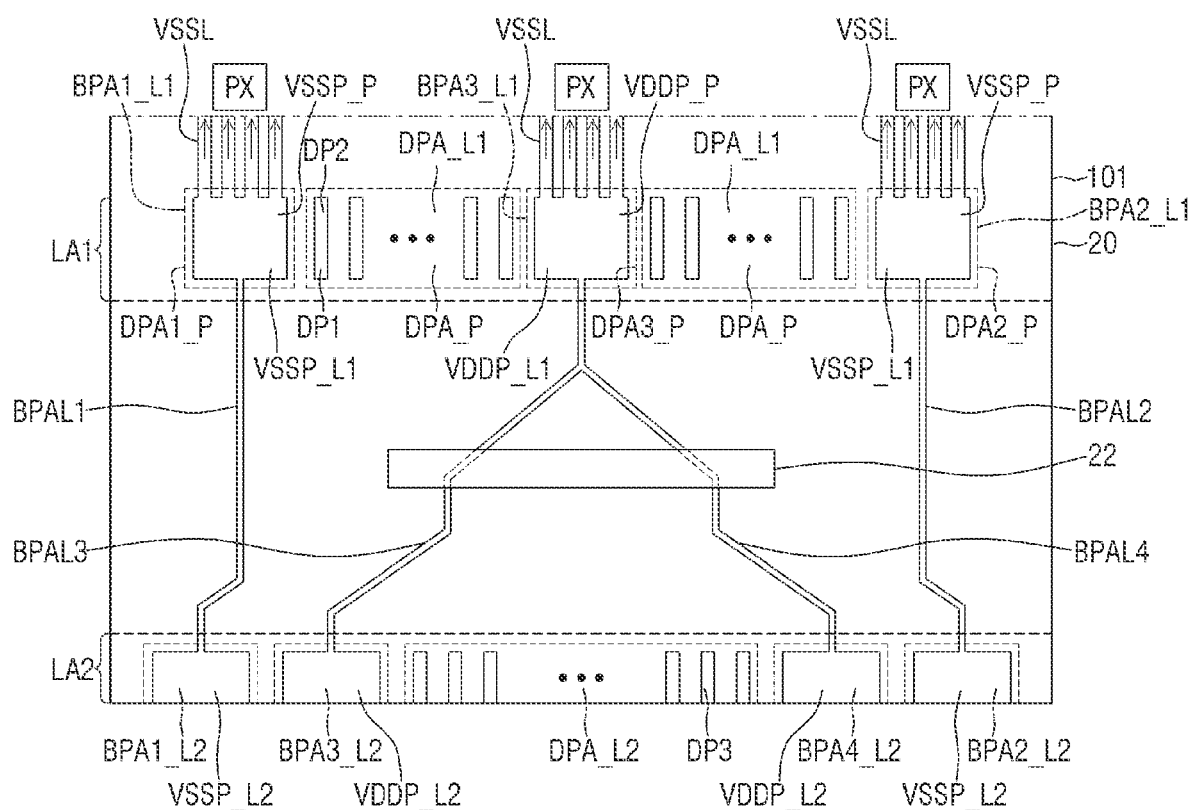
FIG. 9 is a plan view showing that the chip on film of FIG. 8 is attached to the display panel of FIG. 5.
Figure 10:
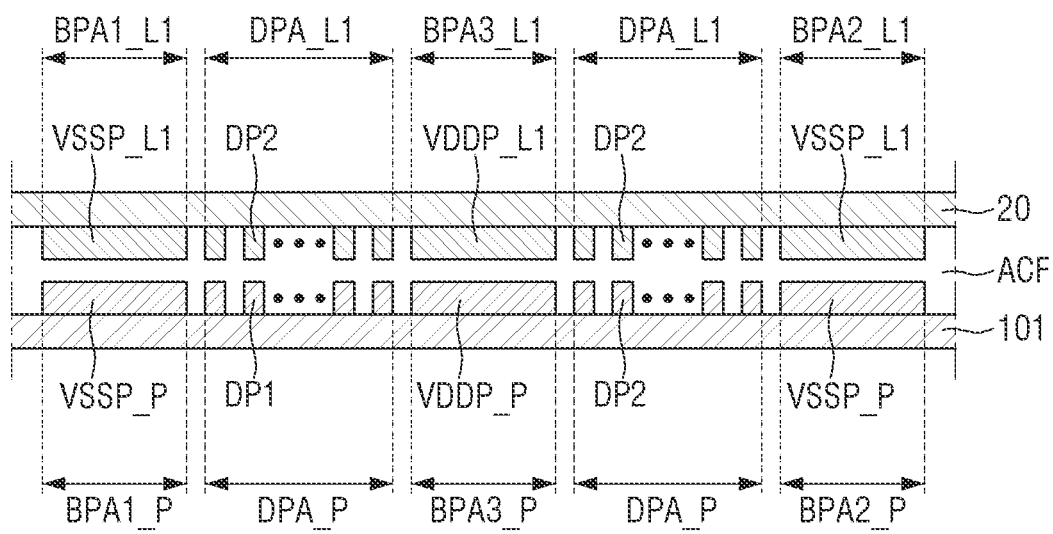
FIG. 10 is a cross-sectional view taken along a line I-I' in FIG. 9.
Figure 11:
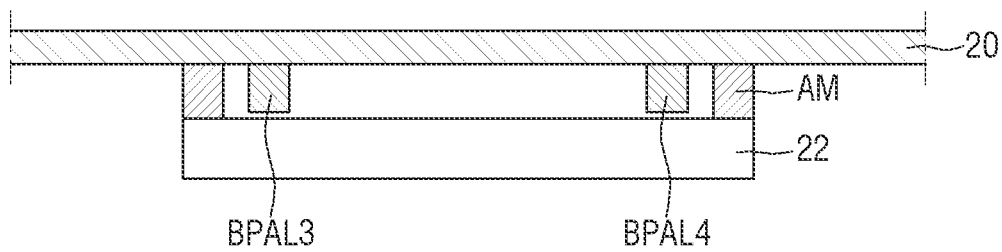
FIG. 11 is a cross-sectional view taken along a line II-II' in FIG. 9.

FIG. 7 is a detailed plan view showing the chip on film of FIG. 4. FIG. 8 is a more detained plan view showing the chip on film of FIG. 7. FIG. 9 is a plan view showing that the chip on film of FIG. 8 is attached to the display panel of FIG. 5. FIG. 10 is a cross-sectional view taken along a line I-I' in FIG. 9. FIG. 11 is a cross-sectional view taken along a line II-II' in FIG. 9.

Referring to FIG. 7 to FIG. 9, the first lead area LA1 may include a first bypass lead area BPA_L1 and a first data lead area DPA_L1. The first bypass lead area BPA_L1 may include a first-first bypass lead area BPA1_L1, a first-second bypass lead area BPA2_L1, and a first-third bypass lead area BPA3_L1.

The first data lead area DPA_L1 may be arranged between the first-first bypass lead area BPA1_L1 and the first-third bypass lead area BPA3_L1, and between the first-second bypass lead area BPA2_L1 and the first-third bypass lead area BPA3_L1.

At least one first bypass lead may be arranged in each of the first-first bypass lead area BPA1_L1 to the first-third bypass lead area BPA3_L1. The first bypass lead may be electrically isolated from the data driver 22.

A plurality of first data leads DP2 may be arranged in the first data lead area DPA_L1. The plurality of first data leads DP2 may be electrically connected to the data driver 22.

The first bypass lead may include a first-first bypass lead arranged in the first-first bypass lead area BPA1_L1, a first-second bypass lead arranged in the first-second bypass lead area BPA1_L1, and a first-third bypass lead area arranged in the first-third bypass lead BPA1_L1.

As described above, the first-first bypass lead area BPA1_L1 may be attached to the first bypass pad area BPA1_P, the first-second bypass lead area BPA2_L1 may be attached to the second bypass pad area BPA2_P, and the first-third bypass lead area BPA3_L1 may be attached to the third bypass pad area BPA3_P. Thus, the same power voltage may be applied to the first-first bypass lead area BPA1_L1 and the first bypass pad area BPA1_P. The same power voltage may be applied to the first-second bypass lead area BPA2_L1 and the second bypass pad area BPA2_P. The same power voltage may be applied to the first-third bypass lead area BPA3_L1 and the third bypass pad area BPA3_P.

Therefore, in following descriptions, the same reference numeral "VSSP_L1" is assigned to the first-first bypass lead and the first-second bypass lead, while a reference numeral "VDDP_L1" is assigned to the first-third bypass lead.

The second lead area LA2 may include a second bypass lead area BPA_L2 and a second data lead area DPA_L2. The second bypass lead area BPA_L2 may include a second-first bypass lead area BPA1_L2, a second-second bypass lead area BPA2_L2, a second-third bypass lead area BPA3_L2, and a second-fourth bypass lead area BPA4_L2.

The second data lead area DPA_L2 may be located between the second-third bypass lead area BPA3_L2 and the second-fourth bypass lead area BPA4_L2. The second-third bypass lead area BPA3_L2 may be located between the second-first bypass lead area BPA1_L2 and the second data lead area DPA_L2. The second-fourth bypass lead area BPA4_L2 may be located between the second-second bypass lead area BPA2_L2 and the second data lead area DPA_L2.

At least one second bypass lead may be located in each of the second-first bypass lead area BPA1_L2 to the second-fourth bypass lead area BPA4_L2. The second bypass lead may be electrically isolated from the data driver 22.

A plurality of second data leads DP3 may be located in each second data lead area DPA_L2. The plurality of second data leads DP3 may be electrically connected to the data driver 22.

The second bypass lead may include a second-first bypass lead located in the second-first bypass lead area BPA1_L2, a second-second bypass lead located in the second-second bypass lead area BPA2_L2, a second-third bypass lead located in the second-third bypass lead area BPA3_L2, and a second-fourth bypass lead located in the second-fourth bypass lead area BPA4_L2.

The second-first bypass lead and the second-second bypass lead may be connected to the first-first bypass area BPA1_J1 and the first-second bypass area BPA2_L1, respectively. Therefore, the same reference numeral "VSSP_L2" may be assigned to the second-first bypass lead and the second-second bypass lead.

Each of the second-third bypass lead and the second-fourth bypass lead may be connected to the first-third bypass area BPA3_L1. Therefore, the same reference numeral "VDDP_L2" may be assigned to the second-third bypass lead and the second-fourth bypass lead.

The second-first bypass lead VSSP_L2 may be connected to the first-first bypass lead VSSP_L1, the second-second bypass lead VSSP_L2 may be connected to the first-second bypass lead VSSP_L1. Each of the second-third bypass lead VDDP_L2 and the second-fourth bypass lead VDDP_L2 may be connected to the first-third bypass lead VDDP_L1.

The second bypass lead and the first bypass lead may be connected to each other via a bypass line BPAL.

The bypass line BPAL of the chip on film (COF) may include a first bypass line BPAL1 that connects the second-first bypass lead VSSP_L2 and the first-first bypass lead VSSP_L1 to each other, a second bypass line BPAL2 connecting the second-second bypass lead VSSP_L2 and the first-second bypass lead VSSP_L1 to each other, a third bypass line BPAL3 connecting the second-third bypass lead VDDP_L2 and the first-third bypass lead VDDP_L1 to each other, and a fourth bypass line BPAL4 connecting the second-fourth bypass lead VDDP_L2 and the first-third bypass lead VDDP_L1 to each other.

Each of the third bypass line BPAL3, and the fourth bypass line BPAL4 may overlap with the data driver 22 in a thickness direction of the device 1. On the contrary, the first bypass line BPAL1 and the second bypass line BPAL2 may not overlap with the data driver 22.

Referring further to FIG. 10, the chip on film and the display panel may be bonded to each other via an anisotropic conductive film ACF. As shown in FIG. 10, the first-first bypass lead VSSP_L1 may overlap with the first bypass pad VSSP_P, the first-second bypass lead VSSP_L1 may overlap with second bypass pad VSSP_P, and the first-third bypass lead VDDP_L1 may overlap with the third bypass pad VDDP_P. The anisotropic conductive film ACF may be located between the first-first bypass lead VSSP_L1 and the first bypass pad VSSP_P overlapping with each other, between the first-second bypass lead VSSP_L1 and the second bypass pad VSSP_P overlapping with each other, and between the first-third bypass lead VDDP_L1 and the third bypass pad VDDP_P overlapping with each other.

In some embodiments, the anisotropic conductive film ACF may be omitted. The first-first bypass lead VSSP_L1 and the first bypass pad VSSP_P overlapping with each other may be ultrasonically bonded to each other. The first-second bypass lead VSSP_L1 and the second bypass pad VSSP_P overlapping with each other may be ultrasonically bonded to each other. The first-third bypass lead VDDP_L1 and the third bypass pad VDDP_P overlapping with each other may be ultrasonically bonded to each other.

Referring further to FIG. 11, the data driver 22 may be mounted on the base film 20 via a bonding member AM. As described above, each of the third bypass line BPAL3 and the fourth bypass line BPAL4 may partially overlap the data driver 22 in the thickness direction. That is, each of the third bypass line BPAL3 and the fourth bypass line BPAL4 may not overlap a middle region of the data driver 22. Since a circuit connected to data leads DP2 and DP3 is located in the middle region of the data driver 220, each of the third bypass line BPAL3 and the fourth bypass line BPAL4 may overlap with each of opposing outer side regions of the data driver 22.

Figure 12:
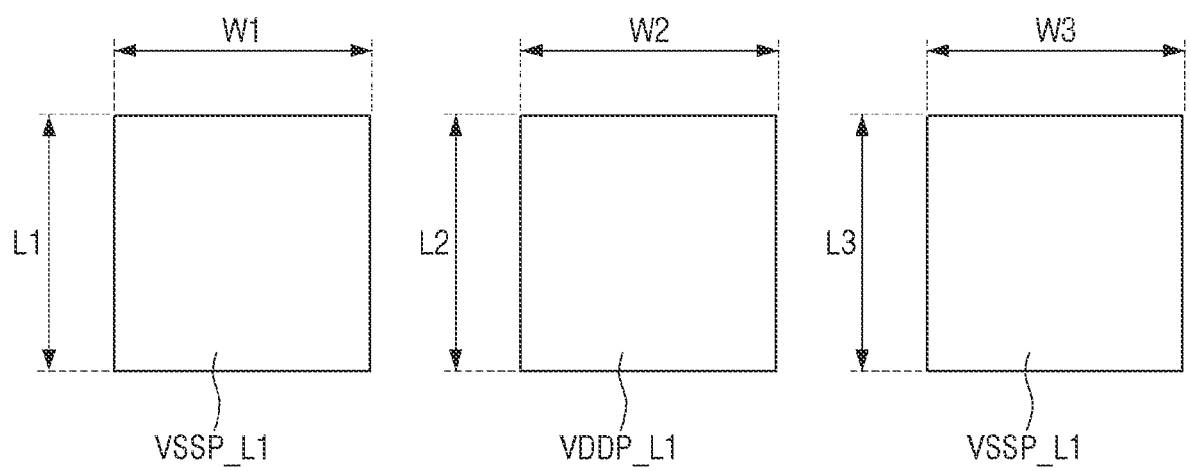
FIG. 12 shows areas of a first-first bypass lead, a first-second bypass lead, and a first-third bypass lead.

FIG. 12 shows an area of each of the first-first bypass lead, the first-second bypass lead, and the first-third bypass lead.

Referring to FIG. 12, the first-first bypass lead VSSP_L1, the first-second bypass lead VSSP_L1, and the first-third bypass lead VDDP_L1 may have first to third areas, respectively. The first-first bypass lead VSSP_L1 may have a first length L1 and a first width W1. The first-second bypass lead VSSP_L1 may have a third length L3 and a third width W3. The first-third bypass lead VDDP_L1 may have a second length L2 and a second width W2.

The first-first bypass lead VSSP_L1 may have the first area defined by the first length L1 and the first width W1. The first-second bypass lead VSSP_L1 may have the third area defined by the third length L1 and the third width W3. The first-third bypass lead VDDP_L1 may have the second area defined by the second length L2 and the second width W2.

Each difference between the first area to the third area may be within about 5%.

According to some embodiments, the first area to the third area may be identical (or substantially identical) to one another.

As shown in FIG. 9, the first bypass pad VSSP_P, the second bypass pad VSSP_P, and the third bypass pad VDDP_P may be respectively located in the opposite side outer region, one side outer region, and the middle region in the first direction DR1 of the pad area PA in a plan view. A spacing between the first bypass pad VSSP_P and the third bypass pad VDDP_P may be the same as a spacing between the third bypass pad VDDP_P and the second bypass pad VSSP_P. Each of differences between the areas of the first bypass pad VSSP_P, the second bypass pad VSSP_P, and the third bypass pad VDDP_P may be within about 5%.

Further, the first-first bypass lead VSSP_L1, the first-second bypass lead VSSP_L1, and the first-third bypass lead VDDP_L1 may be respectively located in the opposite side outer region, one side outer region, and the middle region in the first direction DR1 of the first lead area LA1 in a plan view. A spacing between the first-third bypass lead VDDP_L1 and the first-first bypass lead VSSP_L1 may be equal to a spacing between the first-third bypass lead VDDP_L1 and the first-second bypass lead VSSP_L1. Each of differences between the first area of the first-first bypass lead VSSP_L1, the second area of the first-second bypass lead VSSP_L1, and the third area of the first-third bypass lead VDDP_L1 may be within about 5%.

That is, according to some embodiments, power voltages may be applied to the pixels via the second bypass leads VSSP_L2 and VDDP_L2. Each of the power voltages may be applied to the display panel PN in a form of current via the first-first bypass lead VSSP_L1, the first-second bypass lead VSSP_L1, and the first-third bypass lead VDDP_L1 respectively located in the opposite side outer region, one side outer region, and the middle region in the first direction DR1 of the first lead area LA1 in a plan view and spaced from each other by an equal spacing. An amount of heat emission from an attachment portion between the display panel PN and the chip on film COF may be relatively uniform across the opposite side outer region, one side outer region, and the middle region in the first direction DR1 of the first lead area LA1 in a plan view. Otherwise and, in some alternative systems, the heat emission amount may be concentrated on each of the opposite side outer region and one side outer region in the first direction DR1 of the first lead area LA1 in the plan view. In this case, damage to the data lead DP2 and/or the data pad DP1 adjacent to each of the opposite side outer region and one side outer region in the first direction DR1 of the first lead area LA1 may occur. However, according to some embodiments of the present disclosure, such damage may be prevented or reduced.

Further, in some systems, the first bypass lead may be located between adjacent ones of the plurality of data leads DP2. However, according to some embodiments of the present disclosure, the first-first bypass lead VSSP_L1, the first-second bypass lead VSSP_L1, and the first-third bypass lead VDDP_L1 are respectively located in the opposite side outer region, one side outer region, and the middle region in the first direction DR1 of the first lead area LA1 in a plan view. Thus, a connection design between the first bypass lead and the data lead DP2 may be simplified.

Figure 13:
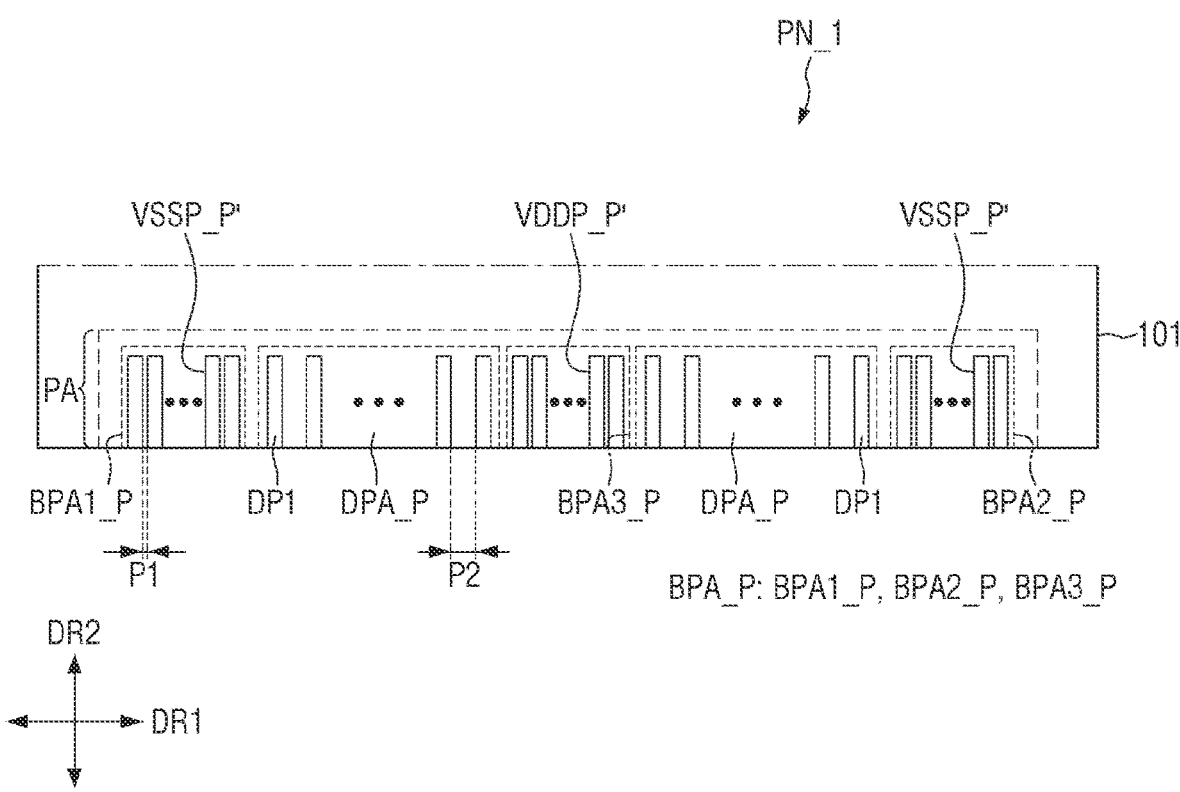
FIG. 13 is a plan view showing a pad area of a display panel according to some embodiments.
Figure 14:
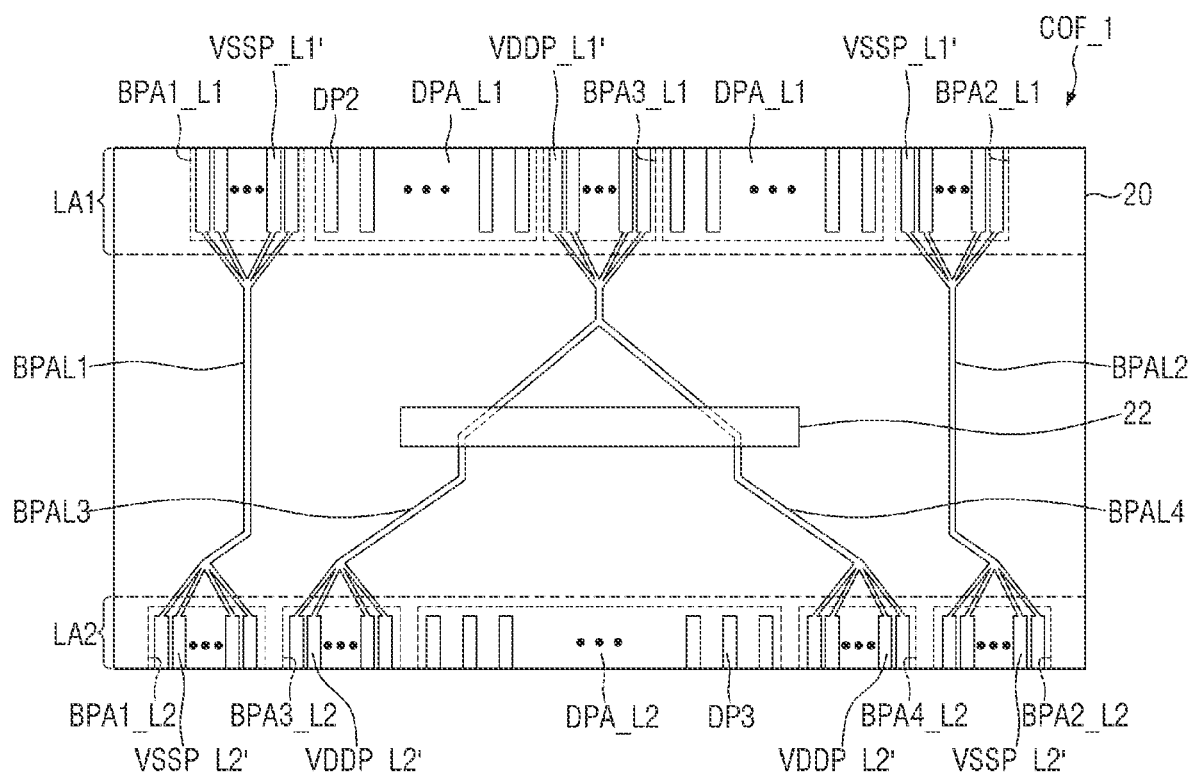
FIG. 14 is a plan view of a chip on film according to some embodiments.

FIG. 13 is a plan view showing a pad area of a display panel according to some embodiments. FIG. 14 is a plan view of a chip on film according to some embodiments.

Referring to FIG. 13 and FIG. 14, a display panel PN_1 and a chip on film COF_1 according to some embodiments may be respectively different from the display panel PN and the chip on film COF according to FIG. 6 to FIG. 9 in that each of a first bypass pad VSSP_P', a second bypass pad VSSP_P', and a third bypass pad VDDP_P' of the display panel PN_1 may include a plurality of patterns; each of a first-first bypass lead VSSP_L1', a first-second bypass lead VSSP_L1', and a first-third bypass lead VDDP_L1' of the chip on film COF_1 may include a plurality of patterns; and each of a second-first bypass lead VSSP_L2', a second-second bypass lead VSSP_L2', a second-third bypass lead VDDP_L2', and a second-fourth bypass lead VDDP_L2' of the chip on film COF_1 may include a plurality of patterns.

According to some embodiments, the plurality of patterns may be arranged along the first direction DR1.

The plurality of patterns of the second-first bypass lead VSSP_L2' may be connected to the first bypass line BPAL1 which in turn may be connected to the plurality of patterns of the first-first bypass lead VSSP_L1'. The plurality of patterns of the second-second bypass lead VSSP_L2' may be connected to the second bypass line BPAL2, which in turn may be connected to the plurality of patterns of the first-second bypass lead VSSP_L1'. The plurality of patterns of the second-third bypass lead VDDP_L2' may be connected to the third bypass line BPAL3, which in turn may be connected to the plurality of patterns of the first-third bypass lead VDDP_L1'. The plurality of patterns of the second-fourth bypass lead VDDP_L2' may be connected to the fourth bypass line BPAL4, which in turn may be connected to the plurality of patterns of the first-third bypass lead VDDP_L1'.

Figure 15:
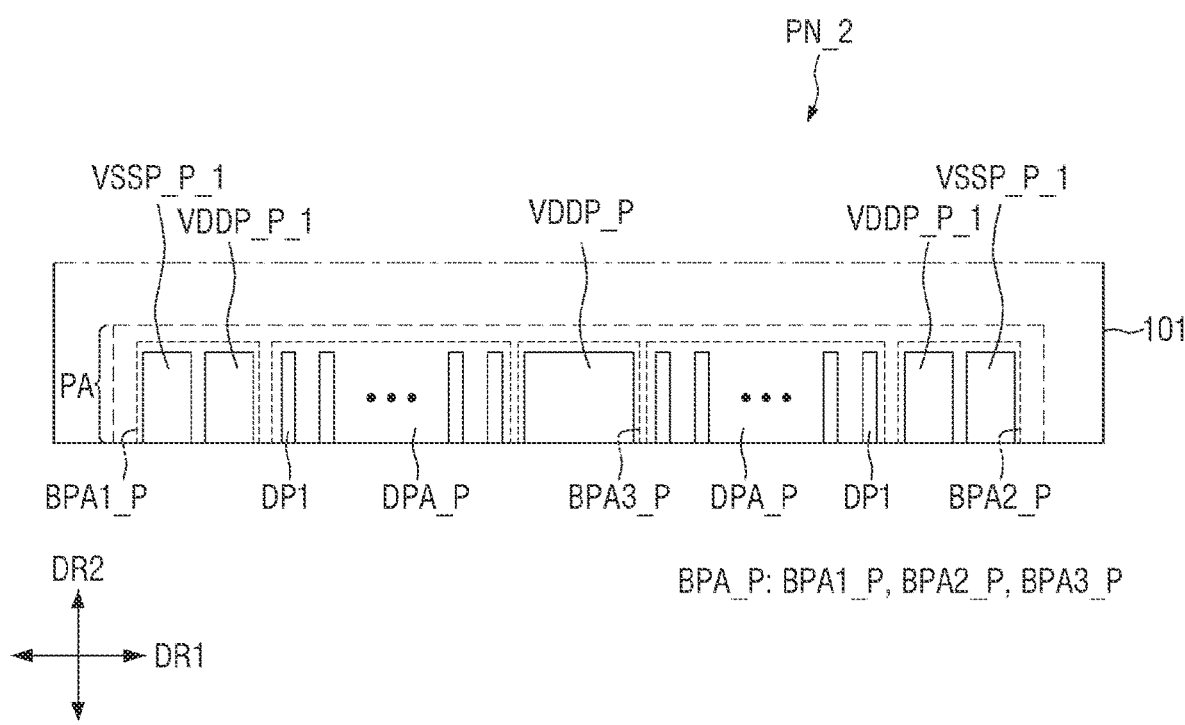
FIG. 15 is a plan view showing a pad area of a display panel according to some embodiments.
Figure 16:
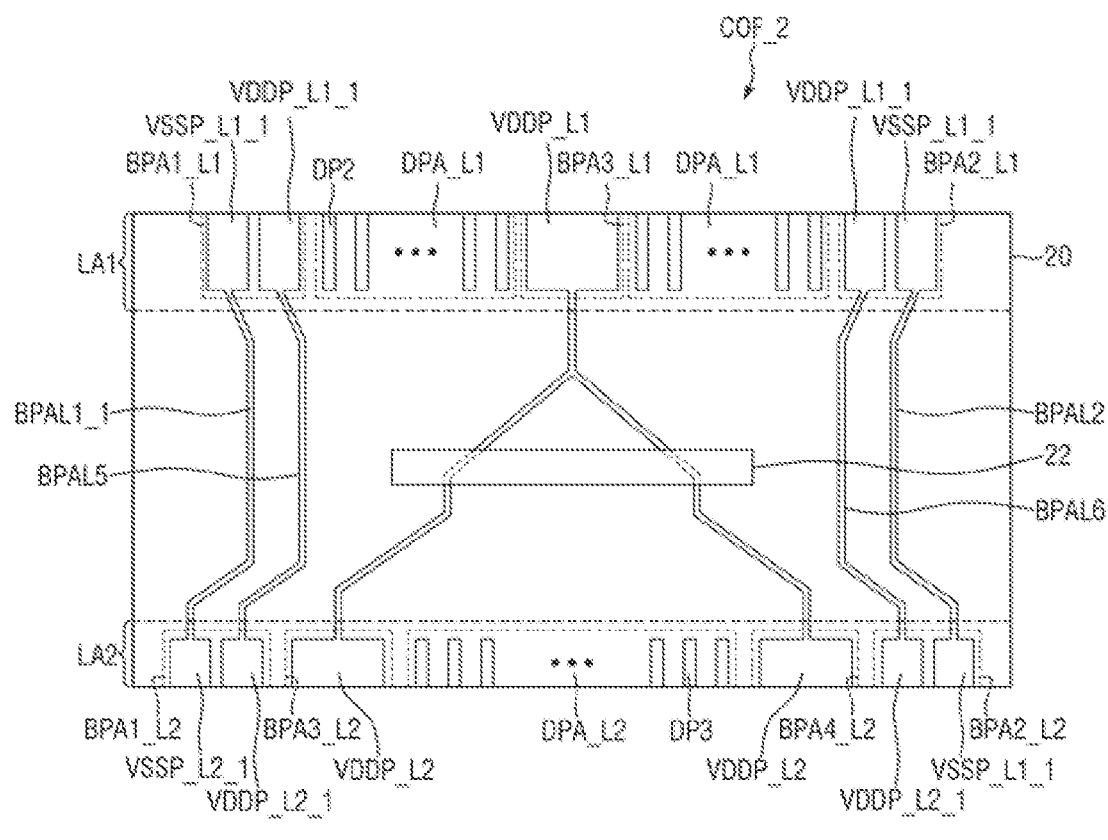
FIG. 16 is a plan view of a chip on film according to some embodiments.

FIG. 15 is a plan view showing a pad area of a display panel according to some embodiments. FIG. 16 is a plan view of a chip on film according to some embodiments.

Referring to FIG. 15 and FIG. 16, a display panel PN_2 and a chip on film COF_2 according to some embodiments may be respectively different from the display panel PN and the chip on film COF according to FIG. 6 to FIG. 9 in that in the display panel PN_2 according to some embodiments, a first bypass pad VSSP_P_1 and a fourth bypass pad VDDP_P_1 may be located in a first bypass pad area BPA1_P, a first bypass pad VSSP_P_1 and a fifth bypass pad VDDP_P_1 may be located in a second bypass pad area BPA2_P; and in the chip on film COF_2, a first-first bypass lead VSSP_L1_1 and a first-fourth bypass lead VDDP_L1_1 may be located in a first-first bypass lead area BPA1_L1, a first-second bypass lead VSSP_L1_1 and a first-fifth bypass lead VDDP_L1_1 may be located in a first-second bypass lead area BPA2_1_1, a second-first bypass lead VSSP_L2_1 and a second-fifth bypass lead VDDP_L2_1 may be located in a second-first bypass lead area BPA1_L2, and a second-second bypass lead VSSP_L1_1 and a second-sixth bypass lead VDDP_L2_1 may be located in a second-second bypass lead area BPA2_L2.

The fourth bypass pad VDDP_P_1 may be located between the first bypass pad VSSP_P_1 and the data pad area DPA_P. The fifth bypass pad VDDP_P_1 may be located between the second bypass pad VSSP_P_1 and the data pad area DPA_P. The second power voltage may be applied to each of the fourth bypass pad VDDP_P_1 and the fifth bypass pad VDDP_P_1.

The first-fourth bypass lead VDDP_L1_1 may be located between the first-first bypass lead VSSP_L1_1 and the first data lead area DPA_L1. The first-fifth bypass lead VDDP_L1_1 may be located between the first-first bypass lead VSSP_L1_1 and the first data lead area DPA_L1. The second power voltage may be applied to each of the first-fourth bypass lead VDDP_L1_1 and the first-fifth bypass lead VDDP_L1_1.

The second-fifth bypass lead VDDP_L2_1 may be located between the second-first bypass lead VSSP_L2_1 and the second data lead area DPA_L2. The second-sixth bypass lead VDDP_L2_1 may be located between the second-first bypass lead VSSP_L2_1 and the second data lead area DPA_L1. The second power voltage may be applied to each of the second-fifth bypass lead VDDP_L2_1 and the second-sixth bypass lead VDDP_L2_1.

The fourth bypass pad VDDP_P_1 may be connected to each of the first-fourth bypass lead VDDP_L1_1 and the second-fifth bypass lead VDDP_L2_1. The fifth bypass pad VDDP_P_1 may be connected to each of the first-fifth bypass lead VDDP_L1_1 and the second-sixth bypass lead VDDP_L2_1.

Figure 17:
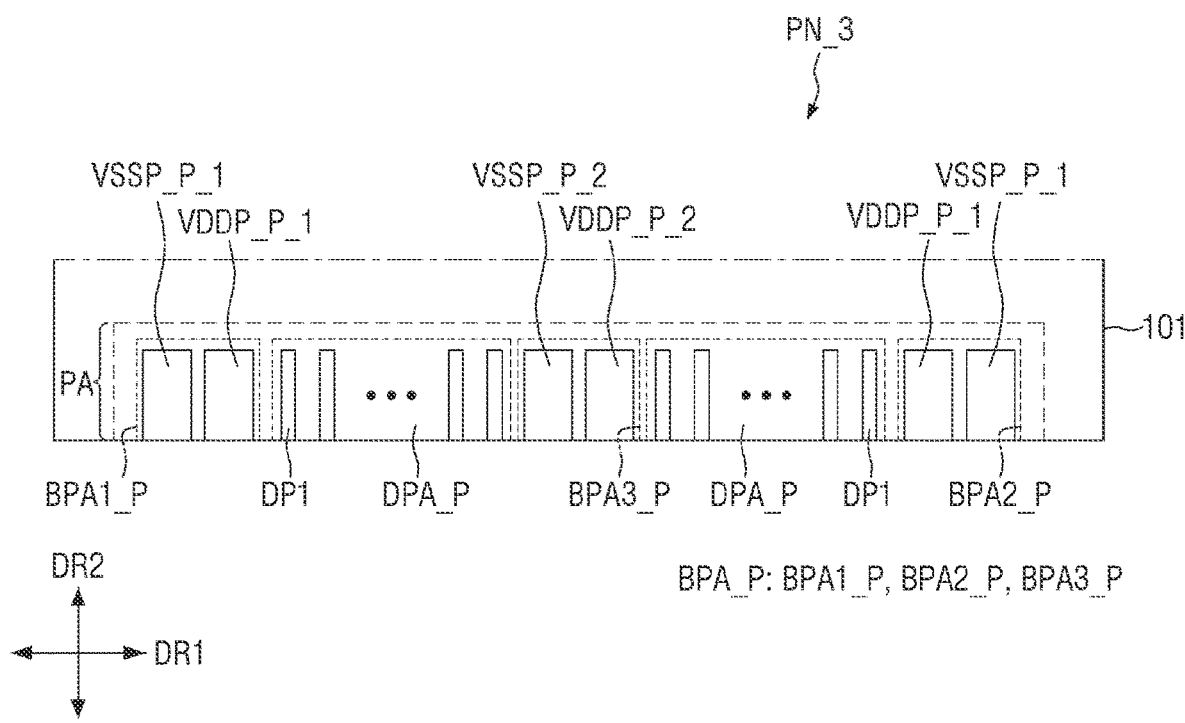
FIG. 17 is a plan view showing a pad area of a display panel according to some embodiments.
Figure 18:
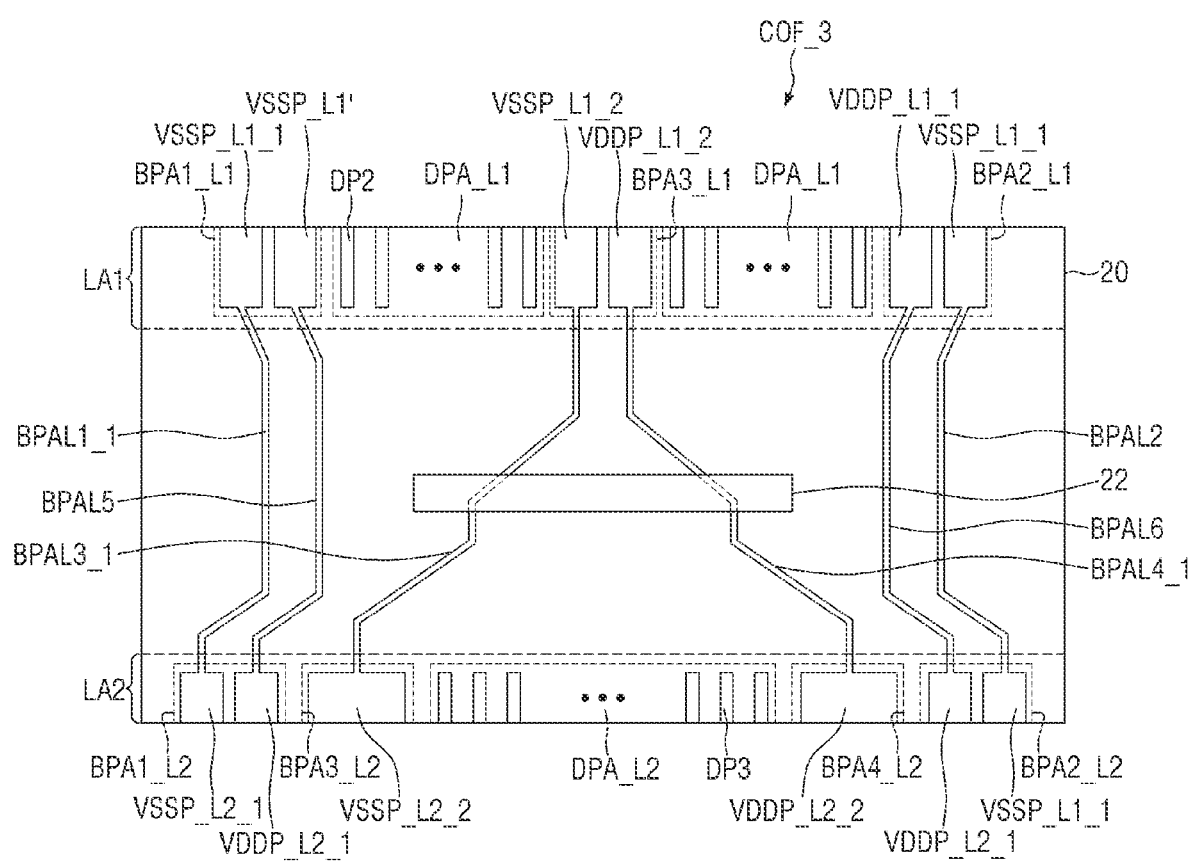
FIG. 18 is a plan view of a chip on film according to some embodiments.

FIG. 17 is a plan view showing a pad area of a display panel according to some embodiments. FIG. 18 is a plan view of a chip on film according to some embodiments.

Referring to FIG. 17 and FIG. 18, a display panel PN_3 and a chip on film COF_3 according to some embodiments may be respectively different from the display panel PN and the chip on film COF according to FIG. 6 to FIG. 9 in that in the display panel PN_3 according to some embodiments, a third bypass pad VDDP_P_2 and a sixth bypass pad VSSP_P_2 may be located in a third bypass pad area BPA3_P; and in the chip on film COF_3, a first-third bypass lead VDDP_L1_2 and a first-sixth bypass lead VSSP_L1_2 may be located in a first-third bypass lead area BPA3_L1.

The sixth bypass pad VSSP_P_2 may be located between the third bypass pad VDDP_P_2 and the data pad area DPA_P.

The first-sixth bypass lead VSSP_L1_2 may be located between the first-third bypass lead VDDP_L1_2 and the first data lead area DPA_L1.

In one example, the first power voltage may be applied to each of the first-sixth bypass lead VSSP_L1_2 and the second-third bypass lead VSSP_L2_2.

The sixth bypass pad VSSP_P_2 may be connected to each of the first-sixth bypass lead VSSP_L1_2 and the second-third bypass lead VSSP_L2_2.

Although aspects of some embodiments of the invention have been disclosed for illustrative purposes, those skilled in the art will appreciate that various modifications, additions and substitutions are possible, without departing from the scope and spirit of the invention as disclosed in the accompanying claims, and their equivalents.

What is claimed is:
1. A display device comprising:
   a display panel having:
   a display area including a plurality of pixels; and
   a non-display area around the display area and including a pad area; and
   a chip on film attached to the pad area of the display panel and spaced apart from the display area in a first direction,
   wherein the chip on film includes a base film, and a data driver on the base film,
   wherein the chip on film includes a first lead area overlapping the pad area and defining one end of the chip on film,
   wherein the first lead area includes a first-first bypass lead area, a first-second bypass lead area, a first-third bypass lead area, and a first data lead area, and the first-third bypass lead area is aligned with the data driver along the first direction,
   wherein the first data lead area is respectively between the first-first bypass lead area and the first-third bypass lead area, and between the first-second bypass lead area and the first-third bypass lead area, wherein the base film includes a first portion which overlaps the data driver and a second portion which corresponds to the first-first bypass lead area, wherein the first portion of the base film and the second portion of the base film are integrally formed.

2. The display device of claim 1, wherein at least one first bypass lead is in each of the first-first bypass lead area, the first-second bypass lead area, and the first-third bypass lead area, wherein the at least one first bypass lead is electrically isolated from the data driver.

3. The display device of claim 2, wherein a plurality of first data leads are in the first data lead area, wherein the plurality of first data leads are electrically connected to the data driver.

4. The display device of claim 3, wherein the at least one first bypass lead includes a first-first bypass lead in the first-first bypass lead area, a first-second bypass lead in the first-second bypass lead area, and a first-third bypass lead in the first-third bypass lead area, wherein a sign of a voltage applied to one of the first-first bypass lead, the first-second bypass lead, and the first-third bypass lead is different from a sign of a voltage applied to each of remaining two of the first-first bypass lead, the first-second bypass lead, and the first-third bypass lead.

5. The display device of claim 4, wherein each of the first-first bypass lead, the first-second bypass lead, and the first-third bypass lead comprise a plurality of patterns.

6. The display device of claim 4, wherein a first voltage is applied to each of the first-first bypass lead and the first-second bypass lead, while a second voltage having a sign different from a sign of the first voltage is applied to the first-third bypass lead.

7. The display device of claim 4, wherein areas of the first-first bypass lead, the first-second bypass lead, and the first-third bypass lead are equal to each other.

8. The display device of claim 4, wherein the chip on film includes a second lead area defining an opposite end of the chip on film, wherein the display device further includes a printed circuit board attached to the second lead area.

9. The display device of claim 8, wherein the second lead area includes a second-first bypass lead area, a second-second bypass lead area, a second-third bypass lead area, a second-fourth bypass lead area and a second data lead area, wherein the second data lead area is located between the second-third bypass lead area and the second-fourth bypass lead area.

10. The display device of claim 9, wherein at least one second bypass lead is in each of the second-first bypass lead area, the second-second bypass lead area, the second-third bypass lead area, and the second-fourth bypass lead area, wherein the at least one second bypass lead is electrically isolated from the data driver.

11. The display device of claim 10, wherein a plurality of second data leads is in the second data lead area, wherein the plurality of second data leads are electrically connected to the data driver.

12. The display device of claim 11, wherein the at least one second bypass lead includes a second-first bypass lead in the second-first bypass lead area, a second-second bypass lead in the second-second bypass lead area, a second-third bypass lead in the second-third bypass lead area, and a second-fourth bypass lead in the second-fourth bypass lead area, wherein a sign of a voltage applied to one of the second-first bypass lead, the second-second bypass lead, the second-third bypass lead, and the second-fourth bypass lead is different from a sign of a voltage applied to each of remaining three of the second-first bypass lead, the second-second bypass lead, the second-third bypass lead, and the second-fourth bypass lead.

13. The display device of claim 12, wherein the second-first bypass lead is connected to the first-first bypass lead, and the second-second bypass lead is connected to the first-second bypass lead, wherein each of the second-third bypass lead and the second-fourth bypass lead is connected to the first-third bypass lead.

14. The display device of claim 13, wherein the chip on film includes:

a first bypass line configured to connect the second-first bypass lead and the first-first bypass lead to each other;

a second bypass line configured to connect the second-second bypass lead and the first-second bypass lead to each other;

a third bypass line configured to connect the second-third bypass lead and the first-third bypass lead to each other; and a fourth bypass line configured to connect the second-fourth bypass lead and the first-third bypass lead to each other.

15. The display device of claim 14, wherein each of the third bypass line and the fourth bypass line overlaps with the data driver in a thickness direction of the device.

16. The display device of claim 4, wherein the at least one first bypass lead includes:

a first-fourth bypass lead between the first-first bypass lead in the first-first bypass lead area and the first data lead; and a first-fifth bypass lead between the first-second bypass lead in the first-second bypass lead area and the first data lead, wherein the first-first bypass lead and the first-fourth bypass lead are spaced from each other, and the first-second bypass lead and the first-fifth bypass lead are spaced from each other.

17. The display device of claim 16, wherein the at least one first bypass lead further includes a first-sixth bypass lead between the first-third bypass lead in the first-third bypass lead area and the first data lead, wherein the first-sixth bypass lead and the first-third bypass lead are spaced from each other.

18. A chip on film of a display device, the chip on film comprising:

a base film; and a data driver on the base film, wherein the chip on film has a first lead area defining one end of the chip on film, wherein the first lead area includes a first-first bypass lead area, a first-second bypass lead area, a first-third bypass lead area, and a first data lead area, each of which are aligned along a first direction, and the first-third bypass lead area is aligned with the data driver along a second direction perpendicular to the first direction, wherein the first data lead area is respectively between the first-first bypass lead area and the first-third bypass lead area, and between the first-second bypass lead area and the first-third bypass lead area, wherein the base film includes a first portion which overlaps the data driver and a second portion which corresponds to the first-first bypass lead area, wherein the first portion of the base film and the second portion of the base film are integrally formed, wherein a first bypass lead is in each of the first-first bypass lead area, the first-second bypass lead area, and the first-third bypass lead area, wherein each of differences between an area size of the first bypass lead in the first-first bypass lead area, an area size of the first bypass lead in the first-second bypass lead area, and an area size of the first bypass lead in the first-third bypass lead area is within 5%.

19. The chip on film of claim 18, wherein the at least one first bypass lead is electrically insulated from the data driver.

20. The chip on film of claim 19, wherein a plurality of first data leads are in the first data lead area, wherein the plurality of first data leads are electrically connected to the data driver.

21. An electronic device comprising:
a display panel having:
a display area including a plurality of pixels; and
a non-display area around the display area and including a pad area; and a chip on film attached to the pad area of the display panel and spaced apart from the display area in a first direction, wherein the chip on film includes a base film, and a data driver on the base film, wherein the chip on film includes a first lead area overlapping the pad area and defining one end of the chip on film, wherein the first lead area includes a first-first bypass lead area, a first-second bypass lead area, a first-third bypass lead area, and a first data lead area, and the first-third bypass lead area is aligned with the data driver along the first direction, wherein the first data lead area is respectively between the first-first bypass lead area and the first-third bypass lead area, and between the first-second bypass lead area and the first-third bypass lead area, wherein the base film includes a first portion which overlaps the data driver and a second portion which corresponds to the first-first bypass lead area, wherein the first portion of the base film and the second portion of the base film are integrally formed.

* * * * *